United States Patent [19]

Nicollini

[11] Patent Number: 4,849,707
[45] Date of Patent: Jul. 18, 1989

[54] HIGH-PRECISION AMPLIFICATION CIRCUIT OF SMALL SIZE AND LOW POWER CONSUMPTION FOR INTEGRATED CIRCUITS

[75] Inventor: Germano Nicollini, Piacenza, Italy
[73] Assignee: SGS-Thomson Microelectronics s.r.L., Milano, Italy
[21] Appl. No.: 175,321
[22] Filed: Mar. 30, 1988
[30] Foreign Application Priority Data
Apr. 14, 1987 [IT] Italy ................. 20110 A/87
[51] Int. Cl.$^4$ ............................................. H03F 3/45
[52] U.S. Cl. .......................................... 330/9; 330/51; 330/69; 328/151
[58] Field of Search .............. 330/9, 107, 109, 51, 330/69; 328/151

[56] References Cited
U.S. PATENT DOCUMENTS
4,609,877 9/1986 Nicollini ................................ 330/9

Primary Examiner—Gene Wan
Attorney, Agent, or Firm—Gerald J. Ferguson, Jr.

[57] ABSTRACT

The amplification circuit comprises an operational amplifier and two groups of capacitances in input and feedback association with the operational amplifier. 2-phase switching means are periodically switched between a position in which two other capacitance groups are charged at output voltage values equal but opposite in sign and a position in which said other capacitances cancel each other out.

4 Claims, 1 Drawing Sheet

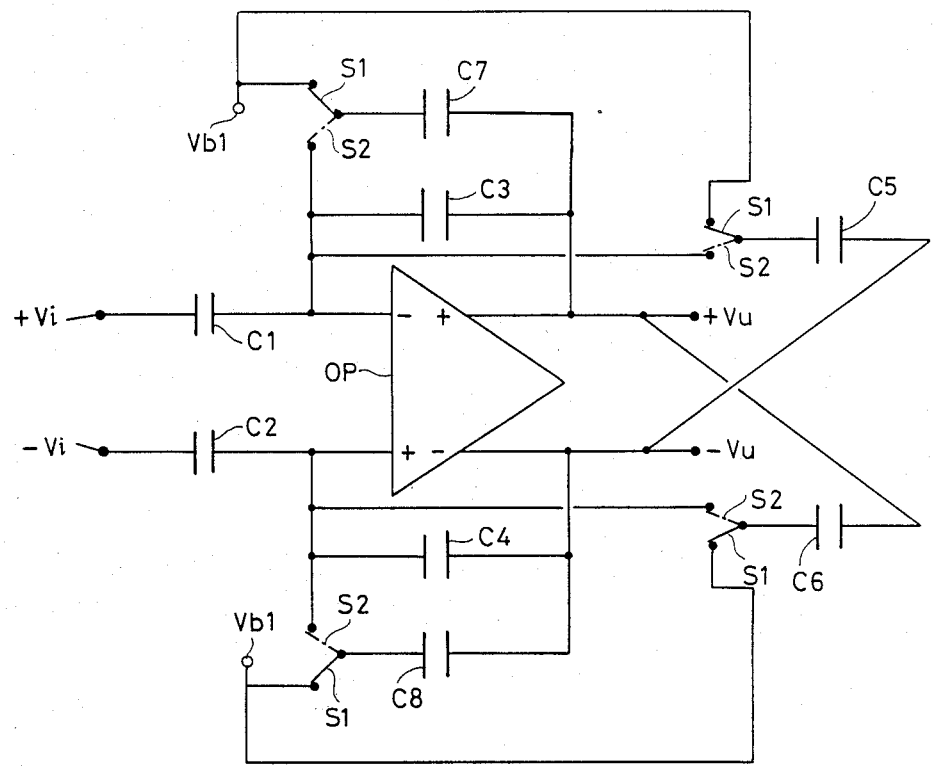

4,849,707

HIGH-PRECISION AMPLIFICATION CIRCUIT OF SMALL SIZE AND LOW POWER CONSUMPTION FOR INTEGRATED CIRCUITS

TECHNICAL FIELD

The present invention relates to a high-precision amplification circuit of small size and low power consumption for integrated circuits.

BACKGROUND OF THE INVENTION

In many integrated circuit devices it is necessary to amplify the signal very accurately. Since this operation can be repeated several times in the same integrated circuit it requires that the amplification stage by very small both as to size or layout area and as to dissipated power.

A presently known amplification circuit comprises an operational amplifier having an input resistance and a feedback resistance; the amplification value is given by the ratio of the two resistances.

This solution is certainly very good when used used with discrete components, while it displays some serious drawbacks if accomplished in an integrated circuit. It requires long resistive paths and hence considerable layout space or, to limit said space, the capacity to handle high feedback currents with the resulting design difficulties of the operational amplifier and high power consumption.

Another known solution, which is preferred by integrated circuit designers, calls for replacement of the two resistances with two capacitances and the use of a periodically open and closed reset switch in parallel with the feedback capacitance. The presence of the switch is necessary to avoid integration of the leakage current unavoidably present on the negative input of the operational amplifier and in any case, even in case of negligible leakage losses, upon ignition to remove the loads accumulated on the input nodes during the integrated circuit manufacturing process.

This solution is undoubtedly advantageous from the point of view of simplicity of accomplishment and layout space. At the same time the periodic switching of the switch inevitably involves the loss of a part of the input signal and forces the operational amplifier to undergo large voltage jumps at the output with the resulting problems of slow rate and settling time of the output signal.

SUMMARY OF THE INVENTION

In view of this state of the art, the object of the present invention is to accomplish a high-precision amplification circuit for integrated circuits which would be advantageous from the point of view of space occupied and power consumed compared with the known resistive solution, without suffering the shortcomings of the known solution with capacitance and switch.

In accordance with the invention said object is achieved by an amplification circuit comprising an operational amplifier with a positive input, a negative input, a positive output and a negative output, characterized in that it comprises a first capacitance placed in series with said negative input and a second capacitance placed in series with said positive input, a third capacitance placed in feedback connection between said positive output and said negative input and a fourth capacitance placed in feedback connection between said negative output and said positive input, a fifth capacitance having a first electrode connected to said negative output and a sixth capacitance having a first electrode connected to said positive output, a seventh capacitance having a first electrode connected to said positive output and an eighth capacitance having a first electrode connected to said negative output, and periodic-switching means to connect alternately a second electrode of said fifth and sixth capacitances to a polarization voltage or to said negative input and to said positive input respectively of the operational amplifier and connect simultaneously a second electrode of said seventh and eighth capacitances to said polarization voltage or to said negative input and to said positive input respectively of the operational amplifier.

BRIEF DESCRIPTION OF THE DRAWING

An example of practical accomplishment of the amplification circuit in accordance with the invention is illustrated for greater clarity in the annexed drawing, the single FIGURE of which shows the basic diagram.

DETAILED DESCRIPTION OF PREFERRED EMBODIMENT

The drawing shows an operational amplifier OP which has a negative input (−) with a first capacitance C1 in series, a positive input (+) with a second capacitance C2 in series, a positive output (+) and a negative output (−).

A third capacitance C3 is placed in feedback connection between the positive output and the negative input of the operational amplifier OP, while a fourth capacitance C4 is placed in feedback connection between the negative output and the positive input of said operational amplifier.

A fifth capacitance C5 has a first electrode connected to the negative output of the operational amplifier OP and a sixth capacitance C6 has a first electrode connected to the positive output of said operational amplifier.

A seventh capacitance C7 has a first electrode connected to the positive output of the operational amplifier OP and an eighth capacitance C8 has a first electrode connected to the negative output of said operational amplifier.

The capacitances C1 and C2 are equal, just as are the other capacitances C3 and C4 and the capacitances C5–C8.

Two-position switches S1 and S2 periodically activated at clock frequency are capable of connecting alternately a second electrode of the capacitances C5 and C6 to a polarization voltage Vb1 or to the negative input and the positive input respectively of the operational amplifier OP and a second electrode of the capacitances C7 and C8 to the polarization voltage Vb1 or to the negative input and to the positive input respectively of the operational amplifier OP.

With the switches in the operating position S1 illustrated in unbroken lines in the drawing, an input signal ±Vi applied through the capacitances C1, C2 to the two inputs of the operational amplifier OP is amplified by a value equal to the ratio of the common value of the capacitances C1, C2 and the common value of the capacitances C3, C4, originating at respective outputs ±Vu. The capacitances C5 and C6 are charged at −Vu and +Vu, respectively and the capacitances C7 and C8 are charged at +Vu and −Vu respectively.

When the commutators pass to the operative phase S2, indicated in dot-dash lines in the drawing, the capacitances C7 and C8 are connected in parallel to the capacitances C3 and C4 and simultaneously an armature of the capacitances C5 and C6 is connected to the negative input and positive input respectively of the operational amplifier OP. In this manner the capacitance C5 and C6 balance the capacitances C7 and C8 so that in feedback to the operational amplifier OP the capacitances C3 and C4 still remain. The gain therefore remains equal to the ratio of the capacitances C1, C2 to the capacitances C3, C4, i.e. it remains unchanged.

During the operative phase S2 the capacitances C5–C8 also fix the continuous voltage to the input of the operational amplifier OP at a value of Vb1, i.e. the inputs go to a continuous value of Vb1.

The proposed solution in accordance with the invention, illustrated as an example in the drawing, permits avoiding employment of a reset switch with the associated shortcomings as described above. In this case, indeed, the continuous charge which is lost as leakage current is compensated for by that associated with the condensers C5–C8, which have an electrode periodically switched to Vb1.

Another advantage of this solution is the construction simplicity of the operational amplifier and the considerable savings in dissipated power, both deriving from the fact that the load is purely capacitive instead of resistive.

For the same reason it is possible to select capacitances of relatively small value with a considerable resulting saving of the layout area occupied.

Precision is finally assured by the fact that amplification is given by a capacitance ratio which in modern integrated circuits can lead to accuracies on the order of 0.1% of the capacitance ratios.

I claim:

1. High-precision amplification circuit for integrated circuits comprising an operations amplifier with a positive input, a negative input, a positive output, and a negative output characterized in that it comprises a first capacitance placed in series with said negative input and a second capacitance placed in series with said positive input, a third capacitance placed in feedback connection between said positive output and said negative input, a fourth capacitance placed in feedback connection between said negative output and said positive input, a fifth capacitance having a first electrode connected to said negative output and a sixth capacitance having a first electrode connected to said positive output, a seventh capacitance having a first electrode connected to said positive output and an eighth capacitance having a first electrode connected to said negative output, and periodic-switching means to connect alternately a second electrode of said fifth and sixth capacitances to a polarization voltage, or to said negative input and to said positive input respectively of the operational amplifier and connect simultaneously a second electrode of said seventh and eighth capacitances to said polarization voltage or to said negative input and to said positive input respectively of the operational amplifier.

2. Amplification circuit in accordance with claim 1 characterized in that said first and second capacitances are of equal value.

3. Amplification circuit in accordance with claim 1 characterized in that said third and fourth capacitances are of equal value.

4. Amplification circuit in accordance with claim 1 characterized in that said fifth, sixth, seventh and eighth capacitances are of equal value.

* * * * *